United States Patent [19]

Mikata et al.

[11] Patent Number: 5,612,236
[45] Date of Patent: Mar. 18, 1997

[54] METHOD OF FORMING A SILICON SEMICONDUCTOR DEVICE USING DOPING DURING DEPOSITION OF POLYSILICON

[75] Inventors: Yuuichi Mikata, Kawasaki; Toshiro Usami; Katsunori Ishihara, both of Yokohama, all of Japan

[73] Assignee: Kabushiki Kaisha Toshiba, Kawasaki, Japan

[21] Appl. No.: 383,946

[22] Filed: Feb. 6, 1995

Related U.S. Application Data

[63] Continuation of Ser. No. 231,973, Apr. 22, 1994, abandoned, which is a continuation of Ser. No. 161,080, Dec. 3, 1993, abandoned, which is a continuation of Ser. No. 789,442, Nov. 7, 1991, abandoned, which is a continuation of Ser. No. 472,404, Feb. 1, 1990, abandoned, which is a continuation of Ser. No. 180,842, Apr. 12, 1988, abandoned.

[30] Foreign Application Priority Data

Apr. 14, 1987  [JP]  Japan ................... 62-89772

[51] Int. Cl.$^6$ .................. H01L 21/265; H01L 21/44; H01L 21/48
[52] U.S. Cl. .................. 437/41; 437/192; 437/200
[58] Field of Search .................. 437/192, 200, 437/41, 41 GS, 40 GS

[56] References Cited

U.S. PATENT DOCUMENTS

| | | | |
|---|---|---|---|
| 3,590,471 | 7/1971 | Lepselter | 437/41 |
| 4,062,034 | 12/1977 | Matsushita | 357/2 |
| 4,285,761 | 8/1981 | Fatula, Jr. et al. | 156/628 |
| 4,443,930 | 4/1984 | Hwang et al. | 437/200 |
| 4,558,507 | 12/1985 | Okabayashi | 357/59 I |
| 4,559,694 | 12/1985 | Yoh et al. | 437/41 |
| 4,569,122 | 2/1986 | Chan | 357/59 I |
| 4,697,333 | 10/1987 | Nakahara | 437/41 |
| 5,055,420 | 10/1991 | Ikeda et al. | 437/34 |

FOREIGN PATENT DOCUMENTS 0071029  2/1983  European Pat. Off.

OTHER PUBLICATIONS

Japanese Patent Publication (Kokoku) No. 48–13583, Apr. 27, 1973.
Widmer et al., Thin Solid Films, vol. 138, No. 1 (Apr. 1986), pp. 131–140: p. 132, lines 1–7, p. 138, Table II, and Fig. 1(b).
Physics of Semiconductor Devices, by Sze, 1981, p. 32 (Figure 21).

Primary Examiner—Mary Wilczewski
Assistant Examiner—Brian K. Dutton
Attorney, Agent, or Firm—Finnegan, Henderson, Farabow, Garrett & Dunner, L.L.P.

[57] ABSTRACT

A semiconductor device includes a semiconductor substrate having a main surface, and a laminated structure. The laminated structure is made up of a nonmonocrystalline silicon layer and a layer of refractory metal or refractory metal silicide, formed on the nonmonocrystalline silicon layer, and formed on the main surface of the semiconductor substrate. The resistivity of the nonmonocrystalline silicon layer is set at less than substantially $1\times10^{-2}$ $\Omega\cdot$cm by doping an impurity thereinto at the time of deposition of the nonmonocrystalline silicon layer.

11 Claims, 3 Drawing Sheets

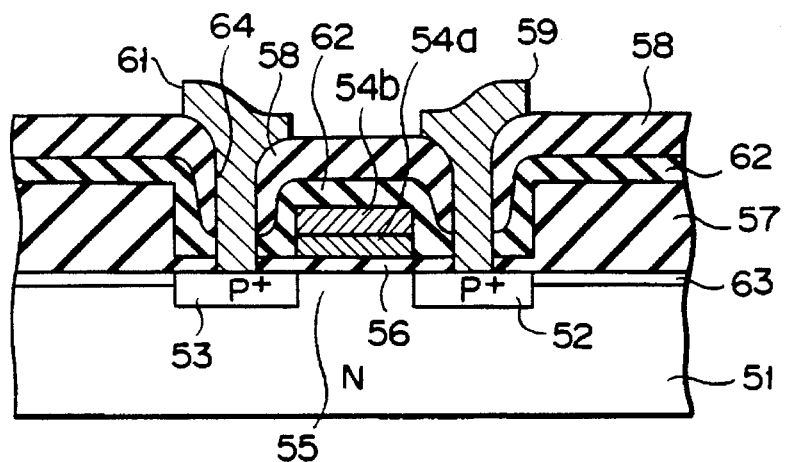
F I G. 1
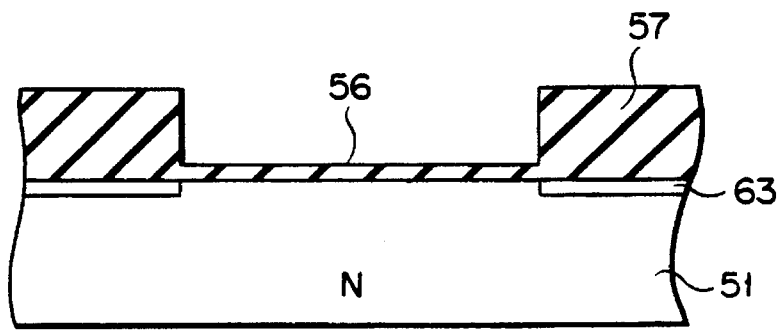
F I G. 2A
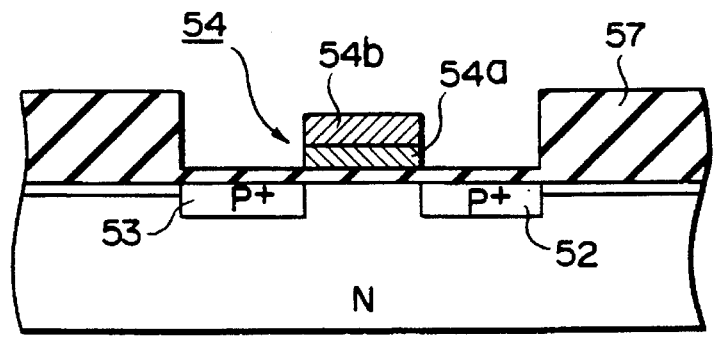
F I G. 2B

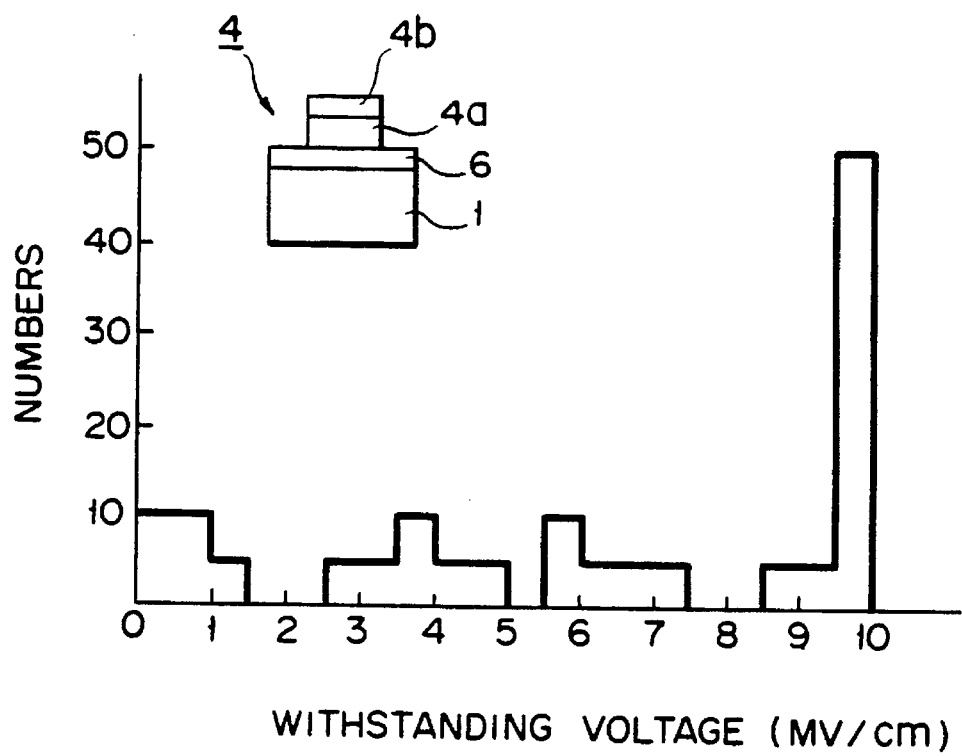
F I G. 4

METHOD OF FORMING A SILICON SEMICONDUCTOR DEVICE USING DOPING DURING DEPOSITION OF POLYSILICON

This application is a continuation, of application Ser. No. 08/231,973 filed Apr. 22, 1994, now abandoned, which is a continuation of application Ser. No. 08/161,080, filed Dec. 3, 1993, now abandoned, which is a continuation application of application Ser. No. 07/789,442, filed Nov. 7, 1991, now abandoned, which is a continuation of application Ser. No. 07/472,404, filed Feb. 1, 1990, now abandoned, which is a continuation of application of Ser. No. 07/180,842, filed Apr. 12, 1988, now abandoned.

BACKGROUND OF THE INVENTION

1. Field of the Invention.

This invention relates to a semiconductor device, and more particularly, to a semiconductor device which features imprements in the electrodes and wiring structures used in the formation of the insulated gate field-effect transistors incorporated in the device.

2. Description of the Related Art.

User demand has made it necessary to develop semiconductor devices and particularly elements constituting integrated circuits which can be formed at a high integration density and can operate at high speed. Three types of conventional insulated gate field-effect transistors (hereinafter referred to as MOS transistors) currently used as the above elements will now be explained, with reference to FIG. 3.

In FIG. 3, $P^+$-type drain region 2 and $P^+$-type source region 3 are formed in the surface area of N-type semiconductor substrate 1. Gate electrode 4 and channel region 5, also formed in the surface area of substrate 1, are arranged such that they oppose each other, with a gate insulation film 6, 100 to 500 Å in thickness, interposed therebetween. Elements 1 to 6 are the basic parts which make up P-channel MOS transistor 10. In order that the device have electrically stable characteristics, it is essential that gate insulation film ($SiO_2$) 6 be protected against external contamination.

To this end, field oxide film 7 is formed for element isolation, and $CVD-SiO_2$ film 8 is deposited thereon as a protection film. Wiring layers 9 and 11 are formed such that they are connected to the drain and source regions.

In the above MOS transistor, gate electrode 4 is often formed of polycrystalline silicon. Polysilicon gate electrode 4 can be used as a mask when $P^+$-type drain and source regions 2 and 3 are formed in a self-alignment process. Moreover, after formation of gate electrode 4, it can be heat-treated at high temperature for activation. With the enhancement of the integration density and operation speed of the integrated circuit using the MOS transistor, it has been strongly required to reduce the resistance of the electrode and wiring sections of the element.

When used as material for the gate electrode, the polysilicon layer exhibits the preferable characteristics. However, even if an impurity is doped in the polysilicon layer at a high impurity concentration by use of a thermal diffusion technique, the resistivity thereof cannot be set lower than $3 \times 10^{-3}$ to $5 \times 10^{-3}$ $\Omega \cdot cm$. As a result, the high speed operation of minute elements is restricted by a low-pass filter formed by the resistance of the electrode wiring section and the capacitance associated with the wiring.

For the reasons described above, it is now common practice to use, in place of the polysilicon layer, metal or metal silicide having a lower resistance, or to use a laminated structure composed of the polysilicon layer and a single- or multi-layered metal silicide, in order to form the gate electrode (which is disclosed in, for example, Japanese Patent Publication No. 48-13583).

In the case where a metal gate electrode is used, the metal gate electrode may tend to react with a silicon film or with a film for insulating layers during a heat treatment process. Therefore, after the formation of the metal gate electrode, the succeeding processes must be effected at low temperature, thus limiting the applicability of the device. In the case where metal silicide is used, silicide of Pt, Ti, Mo, W, Ta or the like can be used. In particular, titanium silicide is used because of its low resistance.

However, in the case where titanium silicide is directly used, the same problem as in the case of using metal will occur.

Further, in the case where a titanium silicide layer is directly formed on a polysilicon film having phosphorus doped therein, leakage current in gate oxide film 6 increases, degrading the voltage withstanding characteristics thereof. The reason for this is considered that the grain size of polysilicon increases because of phosphorus which has been thermally diffused into the polysilicon film, and the grain boundary may be formed from the upper side to the lower side of the polysilicon film, permitting titanium to react with the gate oxide film via the boundary and thus increasing the leakage current. The diffusion of titanium is considered to occur in a heat treatment process at high temperature effected immediately after the titanium silicide is formed.

FIG. 4 shows the withstanding voltage characteristics in the case where polysilicon is used as material for the gate electrode. The abscissa indicates the electric field strength applied to the gate oxide film in mega volt for 1 cm thickness, and the ordinate indicates the number of tested gate oxide films which break down at the tested electric field strength.

The test for the withstanding voltage characteristic has been effected by stepwisely increasing a test voltage of 0.5 MV/cm while keeping the stepped voltage for 0.2 sec until a predetermined leak current flows.

As is clearly seen from FIG. 4, when the gate electrode is formed by depositing a titanium silicide layer on a polysilicon film having phosphorus doped therein, the withstanding voltage of the gate oxide film is lowered and variation in the withstanding voltage becomes large. Such deterioration of the withstanding voltage lowers the yield and reliability of LSIs.

SUMMARY OF THE INVENTION

This invention has been developed in consideration of the facts described above, and has its object to provide a semiconductor device in which the withstanding voltage characteristics of a gate oxide film or the like are prevented from deteriorating and a conductive structure of low resistance can be provided in the case where refractory metal or the silicide thereof is used as material for the gate electrode or wiring.

This invention is applied to a semiconductor device having a MOS transistor formed on, for example, the semiconductor substrate. In the semiconductor device of this invention, a nonmonocrystalline silicon (polysilicon or amorphous silicon) film is formed to have a resistance of less than $1 \times 10^{-3}$ $\Omega \cdot cm$ by mixing an impurity therein during the silicon deposition process. A laminated conductive layer, which is formed of the nonmonocrystalline silicon layer and a layer of refractory metal or silicide thereof formed on the nonmonocrystalline silicon layer, is used as the gate electrode or wiring section formed on the main surface of the semiconductor substrate.

It is preferable to use, as the refractory metal or silicide of the refractory metal, at least one of titanium, tungsten, molybdenum, zirconium, hafnium, and tantalum; or metal silicide formed by combining a selected one of the metals and silicon; or the mixture thereof. At this time, it becomes possible to provide a gate electrode of low resistance without deteriorating the withstanding voltage of the gate oxide film by using a nonmonocrystalline layer of a resistivity less than $1 \times 10-3$ $\Omega \cdot cm$.

BRIEF DESCRIPTION OF THE DRAWINGS

FIG. 1 is a cross sectional view of a MOS transistor according to one embodiment of this invention;

FIGS. 2A and 2B are cross sectional view showing part of the manufacturing process for the MOS transistor of FIG. 1;

FIG. 4 is a graph illustrating the withstanding voltage characteristics of a gate oxide film of the conventional MOS transistor;

DETAILED DESCRIPTION OF THE PREFERRED EMBODIMENTS

Figure 3:
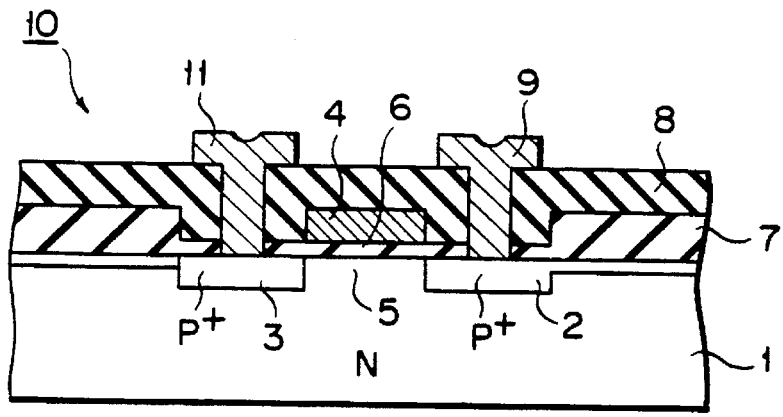
FIG. 3 is a cross sectional view of a conventional MOS transistor.

Now, the invention is explained with reference to the accompanying drawings by taking a MOS transistor as an example.

FIG. 1 is a cross sectional view of a P-channel MOS transistor of this invention which is formed to have a laminated conductive layer as gate electrode 54. The MOS transistor is featured in that laminated conductive layer (gate electrode) 54 formed of nonmonocrystalline silicon layer 54a (which is a polysilicon layer in this embodiment) and refractory metal silicide layer 54b (which is titanium silicide layer in this embodiment) is deposited over the main surface of N-type semiconductor substrate 51, via gate oxide film 56.

Now, the method of manufacturing the MOS transistor is explained. As shown in FIG. 2A, field oxide film ($SiO_2$ film) 57 is formed on N-type silicon substrate 51 with crystal plane (100) indicated by Miller indices, and N-type inversion prevention layer 63 is formed in the surface area of substrate 51 which lies under field oxide film 57. Then a thermal oxidation process is effected to form gate oxide film 56 with a thickness of 100 to 500 Å on an island region (element region) of substrate 51 which is defined by field oxide film 57.

After this, as shown in FIG. 2B, polysilicon layer 54a is deposited to a thickness of 4000 Å on the entire surface of the semiconductor structure by an ordinary low pressure CVD (Chemical Vapour Deposition) method. At this time, in addition to effecting the deposition process, N-type impurity such as phosphorus is doped with an impurity concentration of, for example, $3 \times 10^{20}$ $cm^{-3}$. Then, a sputtering process is effected in an atmosphere of, for example, argon with titanium and silicon used as target material to deposit titanium silicide layer 54b to a thickness of 2000 Å.

Thereafter, a patterning process is effected to form gate electrode (laminated conductive layer) 54, and then P-type impurity such as boron is ion implanted (with an impurity concentration of more than $10^{19}$ $cm^{-3}$) to form $p^+$-type drain and source regions 52 and 53, with gate electrode 54 and field oxide film 57 used as a mask.

Next, as shown in FIG. 1, $SiO_2$ film 62 is deposited by a plasma CVD method, and then CVD-$SiO_2$ film 58 is formed. Finally, contact holes 64 are formed, and an aluminum layer is vapour deposited and patterned to form A wiring layers 59 and 61 which are respectively connected to drain and source regions 52 and 53 via contact holes 64, thus forming a MOS transistor.

In formation of the MOS transistor, polysilicon layer 54a is so formed as to have a low resistance of less than $1 \times 10^{-3}$ $\Omega \cdot cm$ by doping N-type impurity (e.g., phosphorus) at the time of deposition thereof. Therefore, the resultant resistance of the gate electrode which is formed by a combination of polysilicon layer 54a and titanium silicide layer 54b having a low resistance ($2 \times 10^{-5}$ $\Omega \cdot cm$) can be made less than the prior art case. That is, a combination of the polysilicon layer with a resistivity of $1 \times 10^{-3}$ $\Omega \cdot cm$ and a thickness of 4000 Å and the titanium silicide layer with a resistivity of $2 \times 10^{-5}$ $\Omega \cdot cm$ and a thickness of 2000 Å makes it possible to attain the resultant resistance equal to 80% of that attained in the case where phosphorus is doped by thermal diffusion technique, and thus a sheet resistance of 0.8 $\Omega/\square$ or less can be obtained.

Figure 6:
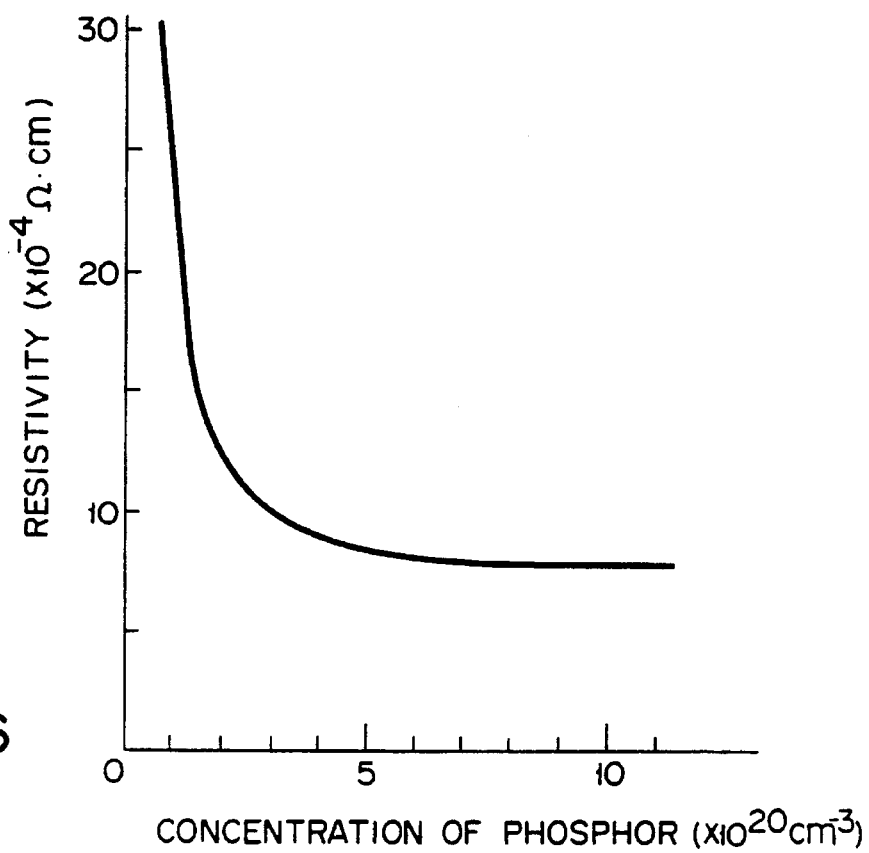
FIG. 6 is a graph exemplifying the relation between the resistivity of the polysilicon layer shown in FIG. 1 and the concentration of phosphorus doped into the polysilicon layer.

An example of the relation between the resistivity of the polysilicon layer and the concentration of the impurity is shown in FIG. 6, in the case where phosphorus is used as the N-type impurity. FIG. 6 clearly indicates that the concentration of phosphorus for obtaining the resistivity of $1 \times 10^{-3}$ $\Omega \cdot cm$ must be about $3 \times 10^{20}$ $cm^{-3}$. However when another element (e.g., boron) is used, the impurity concentration necessary for obtaining the resistivity of $1 \times 10^{-3}$ $\Omega \cdot cm$ may have other values (e.g., more than $1 \times 10^{19}$ $cm^{-3}$).

Further, in the manufacturing process, even if the titanium silicide layer is cut off by the internal stress, the resistance of the gate electrode itself is not affected very much, that is, it does not increase very much because of the low resistance of the polysilicon layer.

Since phosphorus is not doped into the polysilicon layer by a thermal diffusion technique, maximum size of polycrystalline grains, constituting the polysilicon layer and attained immediately after the titanium silicide is formed, is as small as approx. 100 Å. Therefore, titanium diffused from titanium silicide layer 54b is absorbed in the polysilicon layer because of a large area of the polysilicon grains, and only a small part of the diffused titanium can reach gate oxide film 56 under the polysilicon layer, thus preventing the leakage characteristics of gate oxide film 56 from being deteriorated.

In contrast, when phosphorus is diffused by a thermal diffusion technique, the maximum size of the polysilicon grains constituting the polysilicon layer is as large as 5000 Å, and the grain boundary extends from titanium silicide layer 54b to gate oxide film 56, permitting a large part of titanium to reach gate oxide film 56. As a result, titanium reacts with gate oxide film 56, increasing a leakage current to lower the withstanding voltage. Since, in this invention, phosphorus is not thermally doped into the polysilicon layer, the withstanding voltage of the gate electrode is not lowered.

The above embodiment is explained by taking the gate electrode structure of the MOS transistor as an example. However, in the case where this invention is applied to word (or bit) lines of a memory, a high speed operation of an element can be attained because of the low resistance of the word lines. It is also possible to apply this invention to other electrodes such as memory cell capacitors or wiring sections of DRAM's.

In most cases, nonmonocrystalline silicon layer 54a is a polysilicon layer, but can be an amorphous silicon layer. If the temperature of the substrate, at the time when non-monocrystalline silicon is deposited thereon, is set at or less than 600° C., the amorphous silicon layer can be obtained. It is preferable to select refractory metal from a group of titanium (Ti), tungsten (W), molybdenum (Mo), zirconium (Zr), and tantalum (Ta), but it is also possible to use refractory metal of hafnium (Hf), vanadium (V), niobium (Nb) or chrome (Cr). In addition, arsenic, boron, or antimony can be used as impurities to be doped into layer 54a.

Figure 5:
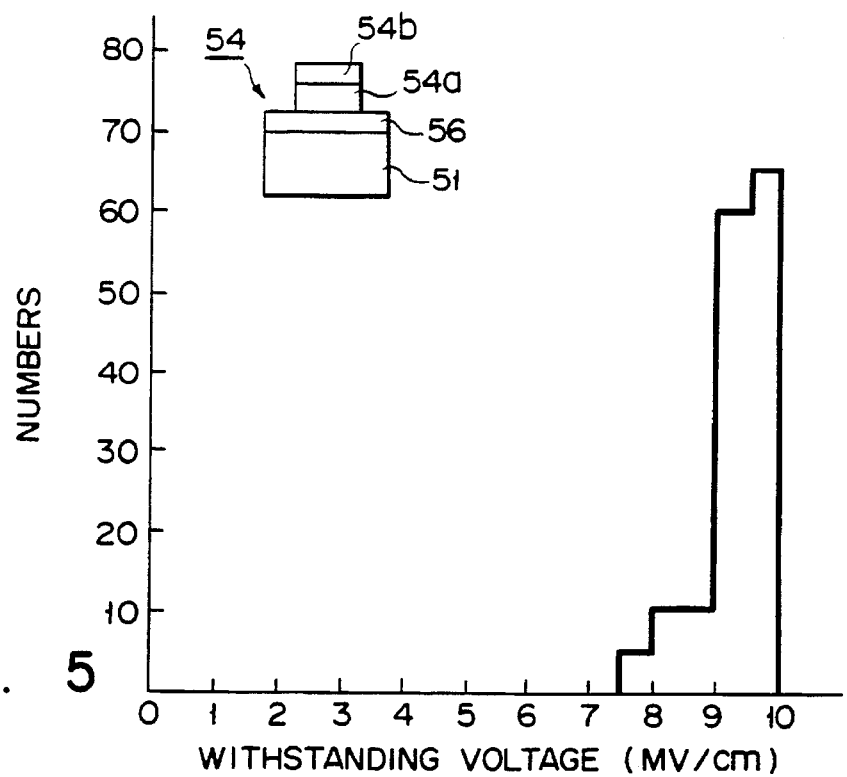
FIG. 5 is a graph illustrating the withstanding voltage characteristics of a gate oxide film of the MOS transistor according to this invention.

FIG. 5 shows the withstanding voltage characteristics of the gate oxide film in the case where the laminated conductive layer of this invention is used as the gate electrode of the MOS transistor. As is clearly seen from FIG. 5, there is no gate oxide film which becomes defective with the withstanding voltage less than 7.5 MV/cm, and the withstanding voltage characteristics can be greatly improved in comparison with the prior art case of FIG. 4 wherein the gate electrode is formed of the titanium silicide layer and polysilicon layer having phosphorus thermally diffused therein.

As described above, according to this invention, the gate oxide film is not deteriorated and the electrode and wiring structure can be formed to have a low resistance, markedly enhancing the yield, reliability and performance of LSI elements or the like.

What is claimed is:

1. A method of forming a silicon semiconductor device comprising the steps of:

(a) preparing a silicon substrate having a crystal plane with a Miller index of "100";

(b) forming a gate oxide film on the silicon substrate at an island region, said gate oxide film having a thickness of less than 50 nm;

(c) forming a polysilicon layer having a thickness greater than the thickness of the gate oxide film by depositing a silicon material on the substrate;

(d) doping a first impurity of a first conductivity type into the polysilicon layer during the depositing of the polysilicon layer in step (c), so that the polysilicon layer has a resistance of less than $1 \times 10^{-3}$ ohm-cm;

(e) forming, by depositing silicon and metal materials on the polysilicon layer, a laminated structure of the polysilicon layer and a metal silicide layer, wherein the laminated structure constitutes a gate electrode;

(f) forming drain and source regions by doping the silicon substrate with a second impurity of a second conductivity type while employing said gate electrode as a mask; and (g) steps (c) and (e) together providing, at the conclusion of step (e), the polysilicon layer with a grain size of approximately ten (10) nanometers.

2. The method of claim 1, wherein said silicon substrate is formed of a material of the first conductivity type.

3. The method of claim 1, wherein said gate oxide film is formed by a thermal oxidation process.

4. The method of claim 1, wherein said silicon material used to form the polysilicon layer in step (c) includes polysilicon.

5. The method of claim 1, wherein said silicon material used to form the polysilicon layer in step (c) includes amorphous silicon.

6. The method of claim 1, wherein said first impurity includes phosphorous.

7. The method of claim 1, wherein said grain size of the polysilicon layer after completing the doping step (d) is 10 nm.

8. The method of claim 1, wherein said first impurity of includes phosphorous, and the concentration of the first impurity in said polysilicon layer is substantially $3 \times 10^{20}$ atoms/cm$^3$.

9. The method of claim 1, wherein said metal materials used to form the metal silicide layer in step (e) include refractory metals.

10. The method of claim 1, wherein an ion-implanting process is used to form the drain and source regions in step (f).

11. The method of claim 1, wherein said second impurity includes boron.

* * * * *